(12) United States Patent
Gomi

(10) Patent No.: US 10,181,488 B2
(45) Date of Patent: Jan. 15, 2019

(54) IMAGING DEVICE

(71) Applicant: OLYMPUS CORPORATION, Hachioji-shi, Tokyo (JP)

(72) Inventor: Yuichi Gomi, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/792,952

(22) Filed: Oct. 25, 2017

(65) Prior Publication Data

US 2018/0047773 A1  Feb. 15, 2018

Related U.S. Application Data

(63) Continuation of application No. PCT/JP2015/064806, filed on May 22, 2015.

(51) Int. Cl.
*H01L 27/146* (2006.01)
*H04N 9/07* (2006.01)
(Continued)

(52) U.S. Cl.
CPC .... *H01L 27/14621* (2013.01); *H01L 27/1465* (2013.01); *H01L 27/14627* (2013.01);
(Continued)

(58) Field of Classification Search
CPC ........ H01L 27/14621; H01L 27/14627; H04N 5/378; H04N 9/07
See application file for complete search history.

(56) References Cited

U.S. PATENT DOCUMENTS 5,453,611 A    9/1995  Oozu et al.
2008/0230123 A1  9/2008  Mitsui et al.
(Continued)

FOREIGN PATENT DOCUMENTS

JP    6-204445 A    7/1994
JP    2008-91535 A    4/2008
(Continued)

OTHER PUBLICATIONS

International Search Report dated Jul. 28, 2015, issued in counterpart of International Application No. PCT/JP2015/064806 (4 pages) w/English Translation.

*Primary Examiner* — Asok K Sarkar
*Assistant Examiner* — Dmitriy Yemelyanov
(74) *Attorney, Agent, or Firm* — Westerman, Hattori, Daniels & Adrian, LLP

(57) ABSTRACT

In an imaging device, a plurality of first photoelectric conversion units generate a first signal based on first visible light and infrared light. A plurality of second photoelectric conversion units generate a second signal based on only second visible light. An infrared absorption layer absorbs the infrared light and transmits only the second visible light. A plurality of third photoelectric conversion units generate a third signal based on the infrared light. A signal processing circuit generates a fourth signal by correcting the first signal using the third signal. The signal processing circuit generates a visible light image signal on the basis of the second signal and the fourth signal. The signal processing circuit generates an infrared light image signal on the basis of the third signal.

7 Claims, 13 Drawing Sheets

(51) Int. Cl.
*H04N 5/378* (2011.01)
*H04N 9/04* (2006.01)

(52) U.S. Cl.
CPC .. *H01L 27/14634* (2013.01); *H01L 27/14652* (2013.01); *H04N 5/378* (2013.01); *H04N 9/045* (2013.01); *H04N 9/07* (2013.01); *H04N 2209/045* (2013.01); *H04N 2209/047* (2013.01)

(56) References Cited

U.S. PATENT DOCUMENTS

| | | | |
|---|---|---|---|
| 2009/0159799 A1* | 6/2009 | Copeland | G01J 3/36 250/338.1 |
| 2011/0115919 A1* | 5/2011 | Hiramoto | H01L 27/14621 348/164 |
| 2013/0182155 A1 | 7/2013 | Egawa | |
| 2013/0235237 A1* | 9/2013 | Aoki | H01L 27/14625 348/294 |

FOREIGN PATENT DOCUMENTS

| | | |
|---|---|---|
| JP | 2008-227091 A | 9/2008 |
| JP | 2013-143533 A | 7/2013 |
| JP | 2014-135535 A | 7/2014 |

* cited by examiner

IMAGING DEVICE

This application is a continuation application based on International Patent Application No. PCT/JP2015/064806 filed on May 22, 2015, the contents of which are incorporated herein by reference.

BACKGROUND OF THE INVENTION

Field of the Invention

The present invention relates to an imaging device.

Description of Related Art

In Japanese Unexamined Patent Application, First Publication No. 2014-135535, a solid-state imaging device which has a plurality of stacked substrates and is capable of obtaining visible light images and infrared light images at the same time has been disclosed. FIG. 11 shows a configuration of a solid-state imaging device 1000 in this related art. A cross-section of the solid-state imaging device 1000 is shown in FIG. 11. As shown in FIG. 11, the solid-state imaging device 1000 includes a first substrate 700, a second substrate 800, and a visible light cut filter 900. The first substrate 700 and the second substrate 800 are stacked in a thickness direction D11 of the first substrate 700.

The first substrate 700 includes a first semiconductor layer 710, a plurality of color filters 720R, a plurality of color filters 720G, and a plurality of micro-lenses 730. In FIG. 11, a reference numeral of one micro-lens 730 is shown as a representative.

The first semiconductor layer 710 includes a plurality of first photoelectric conversion units 711. In FIG. 11, a reference numeral of one first photoelectric conversion unit 711 is shown as a representative.

The plurality of color filters 720R and the plurality of color filters 720G are arranged on a surface of the first semiconductor layer 710. The first substrate 700 further includes a plurality of color filters 720B shown in FIG. 12. In FIG. 11, the plurality of color filters 720B are not shown. The plurality of micro-lenses 730 are arranged on surfaces of the plurality of color filters 720R, the plurality of color filters 720G, and the plurality of color filters 720B.

The second substrate 800 includes a second semiconductor layer 810. The second semiconductor layer 810 includes a plurality of second photoelectric conversion units 811. In FIG. 11, a reference numeral of one second photoelectric conversion unit 811 is shown as a representative.

The visible light cut filter 900 is disposed between the first substrate 700 and the second substrate 800. Light passing through the plurality of first photoelectric conversion units 711 is incident on the visible light cut filter 900. The visible light cut filter 900 blocks visible light included in the incident light.

FIG. 12 shows an array of the plurality of first photoelectric conversion units 711. FIG. 13 shows an array of the plurality of second photoelectric conversion units 811. In FIG. 12 and FIG. 13, the thickness direction D11 of the first substrate 700 is a direction perpendicular to a sheet of each figure. In FIG. 12, a reference numeral of one first photoelectric conversion unit 711 is shown as a representative. In FIG. 13, a reference numeral of one second photoelectric conversion unit 811 is shown as a representative. In FIG. 12 and FIG. 13, positions of the plurality of color filters 720R, the plurality of color filters 720, and the plurality of color filters 720B are indicated by dashed lines. In FIG. 12 and FIG. 13, reference numerals of one color filter 720R, two color filters 720, and one color filter 720B are shown as representatives. The plurality of first photoelectric conversion units 711 and the plurality of second photoelectric conversion units 811 are arranged in a matrix. In addition, the plurality of color filters 720R, the plurality of color filters 720G, and the plurality of color filters 720B are arranged in a matrix.

Light from a subject which has passed through an imaging lens disposed optically forward of the solid-state imaging device 1000 is incident on the plurality of micro-lenses 730. The plurality of micro-lenses 730 collect light passing through the imaging lens. The plurality of color filters 720R, the plurality of color filters 720G, and the plurality of color filters 720B transmit light having a wavelength corresponding to a predetermined color in visible light. The plurality of color filters 720R transmit light having a wavelength corresponding to red, that is, red light. The plurality of color filters 720G transmit light having a wavelength corresponding to green, that is, green light. The plurality of color filters 720B transmit light having a wavelength corresponding to blue, that is, blue light. In general, infrared light passes through the plurality of color filters 720R, the plurality of color filters 720G, and the plurality of color filters 720B.

Each of the plurality of first photoelectric conversion units 711 is arranged in a region corresponding to any one of the plurality of color filters 720R, the plurality of color filters 720G, and the plurality of color filters 720B. Light passing through each of the plurality of color filters 720R, the plurality of color filters 720G, and the plurality of color filters 720B is incident on any one of the plurality of first photoelectric conversion units 711. A first photoelectric conversion unit 711 disposed in a region corresponding to the color filter 720R generates an R signal based on the red light. A first photoelectric conversion unit 711 disposed in a region corresponding to the color filter 720G generates a G signal based on the green light. A first photoelectric conversion unit 711 disposed in a region corresponding to the color filter 720B generates a B signal based on the blue light.

Each of the plurality of second photoelectric conversion units 811 is disposed in a region corresponding to any one of the plurality of color filters 720R, the plurality of color filters 720C and the plurality of color filters 720B. Light passing through the plurality of first photoelectric conversion units 711 is incident on the visible light cut filter 900. Light the visible light of which has been blocked by the visible light cut filter 900 is incident on the plurality of second photoelectric conversion units 811. The plurality of second photoelectric conversion units 811 generate an IR signal based on the infrared light.

First photoelectric conversion units 711 disposed in regions corresponding to the color filter 720R, the color filter 720G, and the color filter 720B absorb some infrared light. For this reason, the first photoelectric conversion units 711 generate an R signal, a G signal, and a B signal containing components based on the red light, the green light, and the blue light respectively and a component based on the infrared light. These R, G, and B signals are corrected by an IR signal generated by the second photoelectric conversion unit 811, and thereby it is possible to obtain an R signal, a G signal, and a B signal from which the component based on the infrared light is removed. The solid-state imaging device 1000 can obtain a signal by removing the component based on the infrared light from a signal containing the components based on the red light, the green light, and the blue light and the component based on the infrared light using the above method. Furthermore, the solid-state imaging device 1000 generates visible light images based on these signals.

As described above, the first photoelectric conversion unit 711 disposed in a region corresponding to each of the color filter 720R, the color filter 720G, and the color filter 720B absorbs some infrared light. For this reason, an R signal, a G signal, and a B signal generated by the plurality of first photoelectric conversion units 711 contain a component based on the infrared light. In FIG. 12, the first photoelectric conversion unit 711 which generates the R signal containing a component based on the infrared light is described as "R+IR" in the vicinity thereof. In FIG. 12, the first photoelectric conversion unit 711 which generates the G signal containing a component based on the infrared light is described as "G+IR" in the vicinity thereof. In FIG. 12, the first photoelectric conversion unit 711 which generates the B signal containing a component based on the infrared light is described as "B+IR" in the vicinity thereof.

Therefore, it is necessary to correct the R signal, the G signal, and the B signal which are generated by the plurality of first photoelectric conversion units 711 using an IR signal generated by the second photoelectric conversion unit 811 to generate a visible light image. The corrected R signal is expressed by Equation (A1). The corrected G signal is expressed by Equation (A2). The corrected B signal is expressed by Equation (A3).

$$R'=R-\alpha IR(r) \qquad (A1)$$

$$G'=G-\beta IR(g) \qquad (A2)$$

$$B'=B-\gamma IR(b) \qquad (A3)$$

In Equation (A1), R' is a value of the corrected R signal, and R is a value of the R signal before the correction. In Equation (A1), α is a coefficient. In Equation (A1), IR(r) is a value of an IR signal generated by the second photoelectric conversion unit 811 disposed in a region corresponding to the color filter 720R. In FIG. 13, the second photoelectric conversion unit 811 which generates the IR signal (IR(r)) is described as "IR(r)" in the vicinity thereof.

In Equation (A2), G' is a value of the corrected G signal, and G is a value of the G signal before the correction. In Equation (A2), β is a coefficient. In Equation (A2), IR(g) is a value of an IR signal generated by the second photoelectric conversion unit 811 disposed in a region corresponding to the color filter 720G In FIG. 13, the second photoelectric conversion unit 811 which generates the IR signal (IR(g)) is described as "IR(g)" in the vicinity thereof.

In Equation (A3), B' is a value of the corrected B signal, and B is a value of the B signal before the correction. In Equation (A3), γ is a coefficient. In Equation (A3), IR(b) is a value of an IR signal generated by the second photoelectric conversion unit 811 disposed in a region corresponding to the color filter 720B. In FIG. 13, the second photoelectric conversion unit 811 which generates the IR signal (IR(b)) is described as "IR(b)" in the vicinity thereof.

SUMMARY OF THE INVENTION

According to a first aspect of the present invention, an imaging device includes a first substrate, a second substrate stacked on the first substrate, and a signal processing circuit. The first substrate includes a plurality of first photoelectric conversion units, a plurality of second photoelectric conversion units, and an infrared absorption layer. The plurality of first photoelectric conversion units generate a first signal based on first visible light and infrared light. A wavelength of the first visible light is a first wavelength of a visible light band. The plurality of second photoelectric conversion units generate a second signal based on only second visible light. A wavelength of the second visible light is a second wavelength of the visible light band. The second wavelength is different from the first wavelength. The infrared absorption layer absorbs the infrared light and transmits only the second visible light. The second substrate includes a plurality of third photoelectric conversion units which generate a third signal based on the infrared light passing through the plurality of first photoelectric conversion units. The signal processing circuit generates a fourth signal by correcting the first signal using the third signal. The signal processing circuit generates a visible light image signal on the basis of the second signal and the fourth signal. The signal processing circuit generates an infrared light image signal on the basis of the third signal.

According to a second aspect of the present invention, in the first aspect, the infrared absorption layer may be a plurality of micro-lenses.

According to a third aspect of the present invention, in the first aspect, the infrared absorption layer may be a plurality of color filters.

According to a fourth aspect of the present invention, in the first aspect, the second substrate may further include a plurality of signal readout circuits which read the third signal from the plurality of third photoelectric conversion units. Each of the plurality of signal readout circuits may be disposed in a region corresponding to at least one of the plurality of second photoelectric conversion units. The first substrate may include a surface which is in contact with the second substrate. A first area of the third photoelectric conversion unit may be larger than a second area of the first photoelectric conversion unit. The first area is an area of the third photoelectric conversion unit on a first cross section of the second substrate. The second area is an area of the first photoelectric conversion unit on a second cross section of the first substrate. The first cross section and the second cross section are parallel to the surface.

According to a fifth aspect of the present invention, in the first aspect, the first visible light may include green light. The second visible light may include red light or blue light. The plurality of second photoelectric conversion units may include the second photoelectric conversion unit which generates the second signal based on only the red light and the second photoelectric conversion unit which generates the second signal based on only the blue light. An array of the plurality of first photoelectric conversion units and the plurality of second photoelectric conversion units may also be an array corresponding to the Bayer array.

According to a sixth aspect of the present invention, in the first aspect, the first visible light may include blue light. The second visible light may include red light or green light. The plurality of second photoelectric conversion units may include the second photoelectric conversion unit which generates the second signal based on only the red light, and the second photoelectric conversion unit which generates the second signal based on only the green light. An array of the plurality of first photoelectric conversion units and the plurality of second photoelectric conversion units may be an array corresponding to the Bayer array.

According to a seventh aspect of the present invention, in the first aspect, each of the plurality of third photoelectric conversion units may receive light passing through two or more of the plurality of first photoelectric conversion units.

DETAILED DESCRIPTION OF THE INVENTION

Embodiments of the present invention will be described with reference to drawings.

First Embodiment

Figure 1:
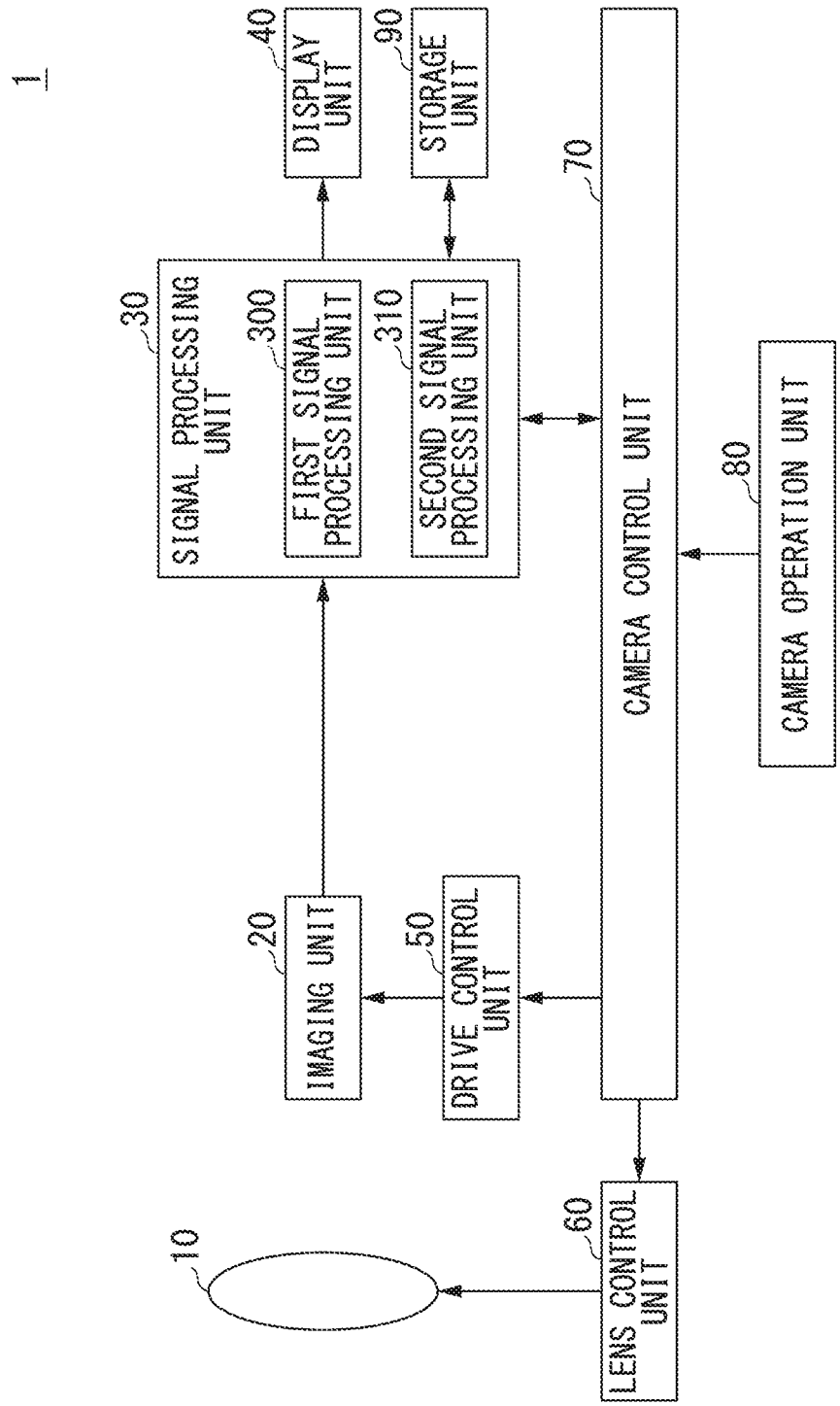
FIG. 1 is a block diagram which shows a configuration of an imaging device according to a first embodiment of the present invention.

FIG. 1 shows a configuration of an imaging device 1 according to a first embodiment of the present invention. The imaging device 1 is an electronic device having an imaging function. For example, the imaging device 1 may be a digital camera, a digital video camera, an endoscope, and the like. As shown in FIG. 1, the imaging device 1 includes a lens 10, an imaging unit 20 (solid-state imaging device), a signal processing unit 30 (signal processing circuit), a display unit 40, a drive control unit 50, a lens control unit 60, a camera control unit 70, a camera operation unit 80, and a storage unit 90.

The lens 10 has a zoom function and a focus function. The lens 10 forms a subject image on a light-receiving surface of the imaging unit 20 based on light from a subject. The lens control unit 60 controls zooming, focusing, an aperture of the lens 10 and the like. An image based on light captured via the lens 10 is formed on the light-receiving surface of the imaging unit 20. The imaging unit 20 generates an R signal, a G signal, a B signal, and an IR signal based on the subject image formed on the light-receiving surface. The drive control unit 50 drives the imaging unit 20 and controls an operation of the imaging unit 20.

The signal processing unit 30 performs predetermined processing on each signal output from the imaging unit 20. The signal processing unit 30 includes a first signal processing unit 300 and a second signal processing unit 310. The first signal processing unit 300 performs processing related to generation of visible light image signals. The second signal processing unit 310 performs processing related to generation of infrared light image signals. The signal processing unit 30 may be included in the imaging unit 20.

The display unit 40 displays a visible light image based on the visible light image signal generated by the signal processing unit 30. In addition, the display unit 40 displays an infrared light image based on the infrared light image signal generated by the signal processing unit 30. The visible light image and the infrared light image may be still images or moving images.

The storage unit 90 stores the visible light image signal and the infrared light image signal generated by the signal processing unit 30. The storage unit 90 may also be detachable from the imaging device 1. That is, the storage unit 90 does not need to be a unique constituent in the imaging device 1.

The camera control unit 70 controls an entirety of the imaging device 1. An operation of the camera control unit 70 is defined in a program stored in a ROM embedded in the imaging device 1. The camera control unit 70 reads this program and performs various types of control according to contents defined by the program.

The camera operation unit 80 has various types of operational elements for users to input various types of operations to the imaging device 1. The camera operation unit 80 outputs a signal based on a result of an operation input to the camera control unit 70.

Figure 2:
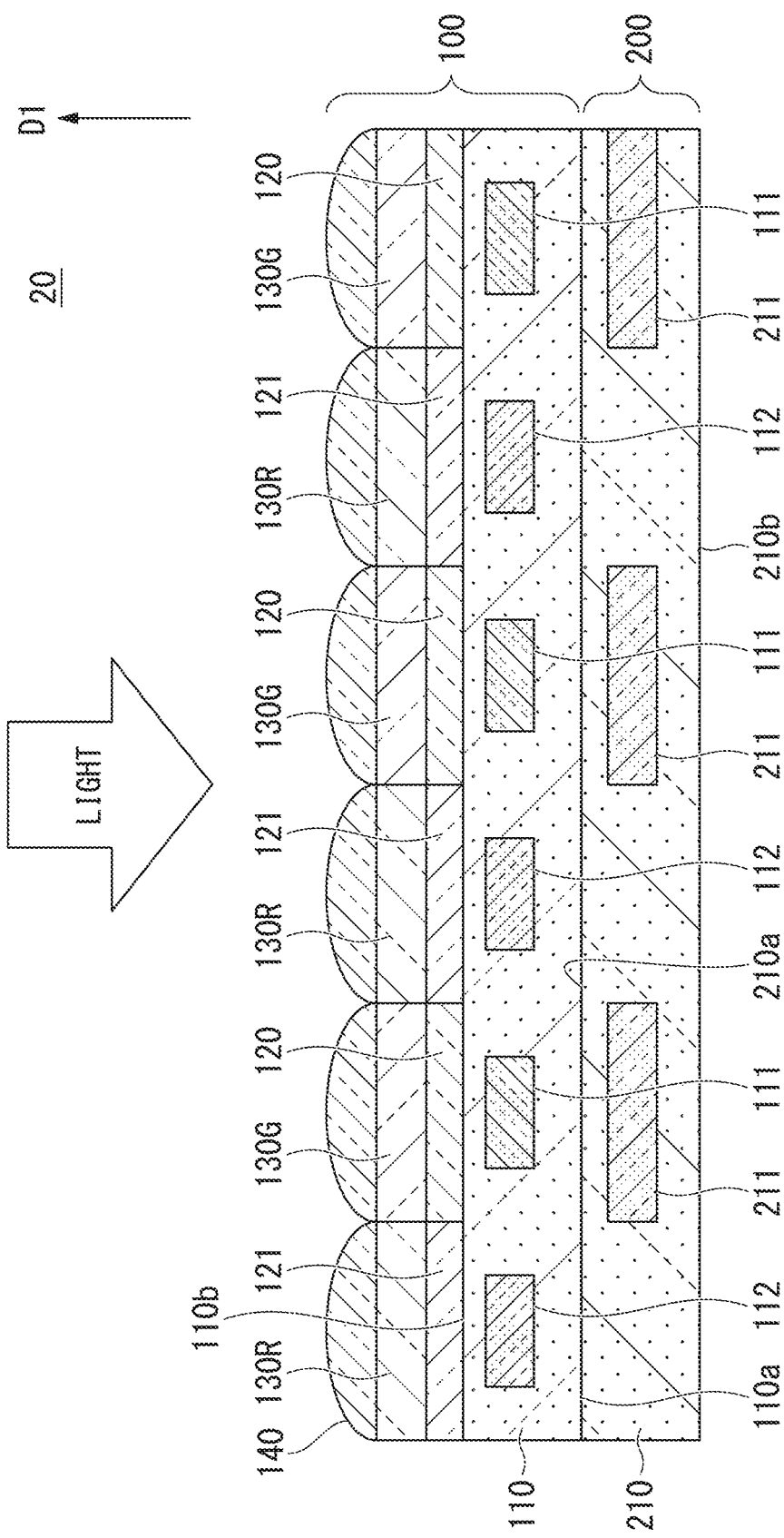
FIG. 2 is a cross-sectional diagram of an imaging unit in the imaging device according to the first embodiment of the present invention.

FIG. 2 shows a cross-section of a part of the imaging unit 20. As shown in FIG. 2, the imaging unit 20 includes a first substrate 100 and a second substrate 200. The first substrate 100 and the second substrate 200 are stacked in a thickness direction D1 of the first substrate 100. The thickness direction D1 of the first substrate 100 is a direction perpendicular to a first surface 110a.

Dimensions of portions constituting the imaging unit 20 may not conform to dimensions shown in FIG. 2. The dimensions of portions constituting the imaging unit 20 are arbitrary as long as their functions are realized.

The first substrate 100 includes the first semiconductor layer 110, a plurality of transparent layers 120, a plurality of infrared absorption layers 121, a plurality of color filters 130R, a plurality of color filters 130G, and a plurality of micro-lenses 140. In FIG. 2, a reference numeral of one micro-lens 140 is shown as a representative.

The first semiconductor layer 110 includes a plurality of first photoelectric conversion units 111 and a plurality of second photoelectric conversion units 112. The first semiconductor layer 110 is constituted by a semiconductor material such as silicon (Si). For example, the first photoelectric conversion unit 111 and the second photoelectric conversion unit 112 may be constituted by a semiconductor material whose impurities and impurity concentrations are different from those of the semiconductor material constituting the first semiconductor layer 110. The first semiconductor layer 110 includes the first surface 110a and a second surface 110b. The first surface 110a is in contact with the second substrate 200. The second surface 110b is in contact with the plurality of transparent layers 120 and the plurality of infrared absorption layers 121.

The plurality of transparent layers 120 and the plurality of infrared absorption layers 121 are arranged on the second surface 110b. The plurality of transparent layers 120 and the plurality of infrared absorption layers 121 are formed of a material with high light transmissivity. The transparent layer 120 is constituted by, for example, a transparent resin. The infrared absorption layer 121 is constituted by, for example, a transparent resin to which an infrared absorption dye is added. The infrared absorption dye is a cyanine compound, a phthalocyanine compound, a dithiol metal complex, a naphthoquinone compound, a diimmonium compound, an azo compound, and the like.

The plurality of first photoelectric conversion units 111 are arranged in a region corresponding to the transparent layer 120. That is, the plurality of first photoelectric conversion units 111 are arranged at positions on which light passing through the transparent layer 120 is incident. The plurality of second photoelectric conversion units 112 are arranged in a region corresponding to the infrared absorption layer 121. That is, the plurality of second photoelectric conversion units 112 are arranged at positions on which light passing through the infrared absorption layer 121 is incident.

The plurality of color filters 130G are arranged on surfaces of the plurality of transparent layers 120. The plurality of color filters 130R are arranged on surfaces of the plurality of infrared absorption layers 121. The first substrate 100 further includes the plurality of color filters 130B shown in FIG. 3, and the plurality of color filters 130B are arranged on the surfaces of the plurality of infrared absorption layers 121. The plurality of color filters 130B are not shown in FIG. 2. The plurality of micro-lenses 140 are arranged on surfaces of the plurality of color filters 130R, the plurality of color filters 130G, and the plurality of color filters 130B.

The second substrate 200 includes a second semiconductor layer 210. The second semiconductor layer 210 includes a plurality of third photoelectric conversion units 211. The second semiconductor layer 210 is constituted by a semiconductor material such as silicon (Si). For example, the third photoelectric conversion unit 211 is constituted by a semiconductor material whose impurities and impurity concentrations are different from those of the semiconductor material constituting the second semiconductor layer 210. Each of the plurality of third photoelectric conversion units 211 is disposed in a region corresponding to any one of the plurality of first photoelectric conversion units 111. That is, each of the plurality of third photoelectric conversion units 211 is disposed at a position on which light passing through any one of the plurality of first photoelectric conversion units 111 is incident. The second semiconductor layer 210 includes a first surface 210a and a second surface 210b. The first surface 210a is in contact with the first substrate 100. The second substrate 200 further includes a signal readout circuit 220 shown in FIG. 4.

Figure 3:
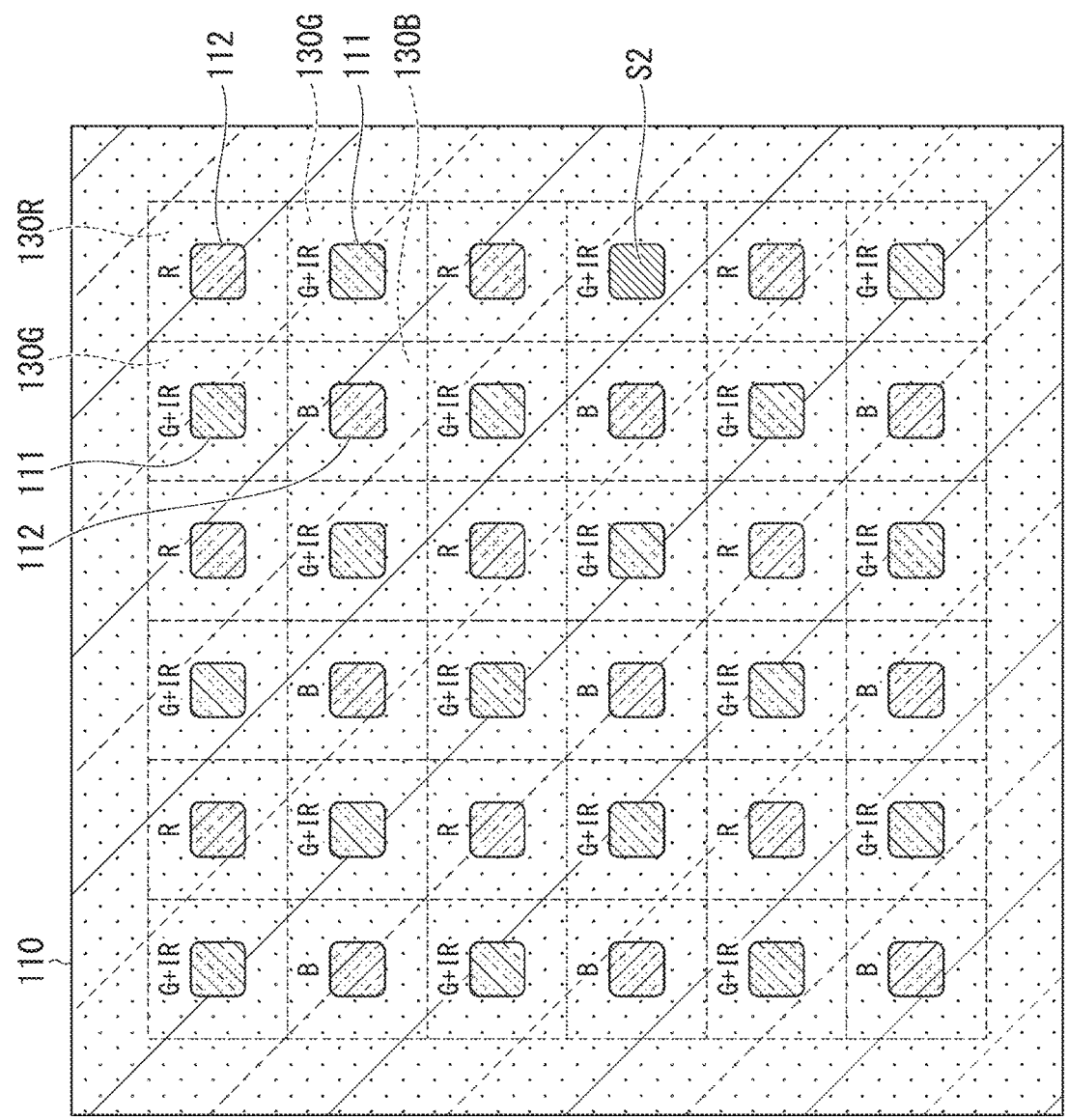
FIG. 3 is a cross-sectional diagram which shows an array of a plurality of first photoelectric conversion units and a plurality of second photoelectric conversion units in the imaging device according to the first embodiment of the present invention.
Figure 4:
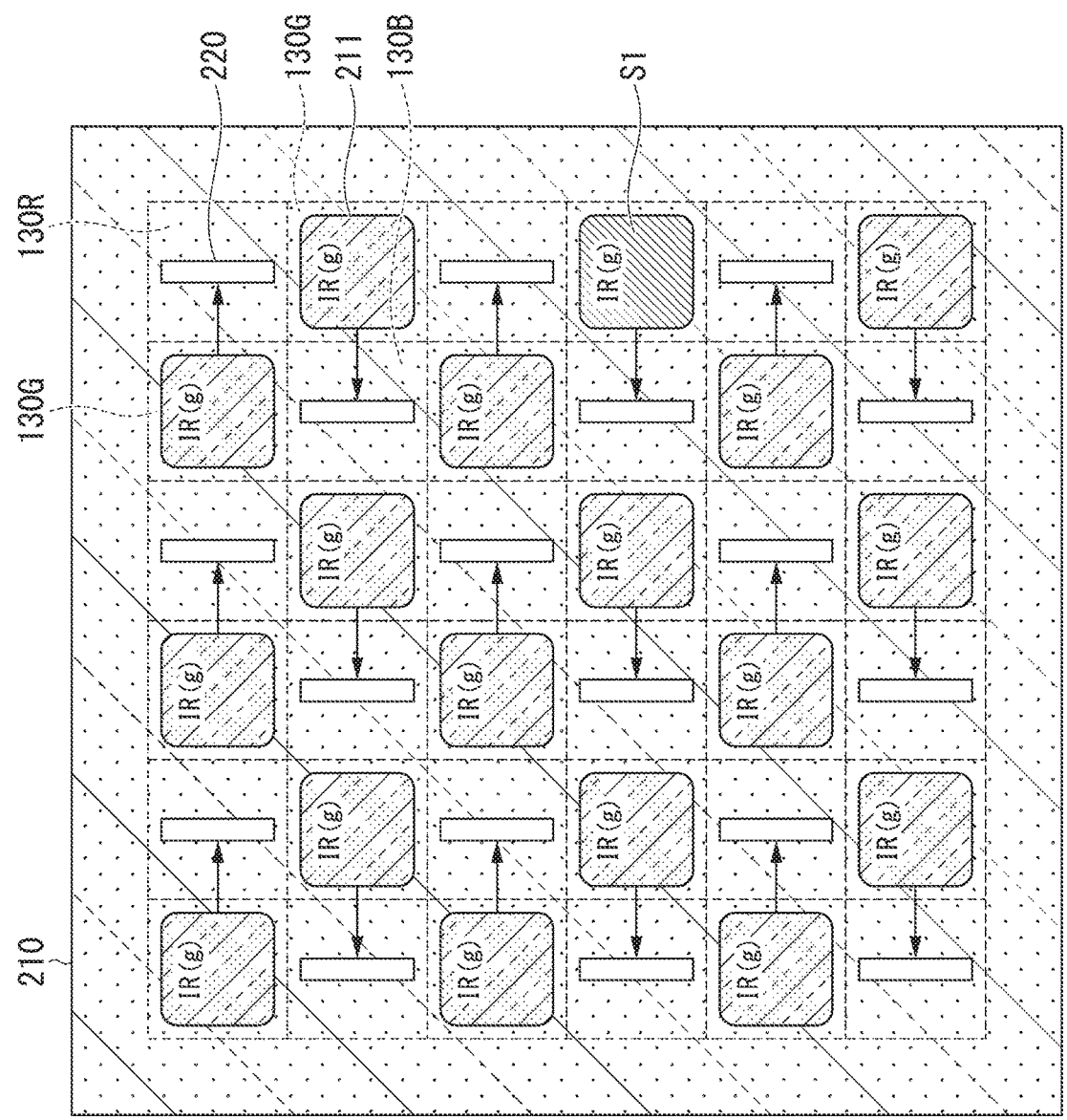
FIG. 4 is a cross-sectional diagram which shows an array of a plurality of third photoelectric conversion units in the imaging device according to the first embodiment of the present invention.

FIG. 3 shows an array of the plurality of first photoelectric conversion units 111 and the plurality of second photoelectric conversion units 112. FIG. 4 shows an array of the plurality of third photoelectric conversion units 211. In FIG. 3 and FIG. 4, the thickness direction D1 of the first substrate 100 is a direction perpendicular to a sheet of each figure. In FIG. 3, reference numerals of two first photoelectric conversion units 111 and two second photoelectric conversion units 112 are shown as representatives. In FIG. 4, a reference numeral of one third photoelectric conversion unit 211 is shown as a representative. In FIG. 3 and FIG. 4, positions of the plurality of color filters 130R, the plurality of color filters 130G, and the plurality of color filters 130B are indicated by dashed lines. In FIG. 3 and FIG. 4, reference numerals of one color filter 130R, two color filters 130G, and one color filter 130B are shown as representatives. The plurality of first photoelectric conversion units 11, the plurality of second photoelectric conversion units 112, and the plurality of third photoelectric conversion units 211 are arranged in a matrix. In addition, the plurality of color filters 130R, the plurality of color filters 130G, and the plurality of color filters 130B are arranged in a matrix.

Light from a subject which has passed through the lens 10 disposed optically forward of the imaging unit 20 is incident on the plurality of micro-lenses 140. The plurality of micro-lenses 140 collect light which has passed through the lens 10. Light which has passed through the plurality of micro-lenses 140 includes the visible light and the infrared light. The visible light includes the red light, the green light, and the blue light. A wavelength of the red light is a red wavelength in a visible light band. A wavelength of the green light is a green wavelength in the visible light band. A wavelength of blue light is a blue wavelength in the visible light band. Light which has passed through the plurality of micro-lenses 140 is incident on the plurality of color filters 130R, the plurality of color filters 130G, and the plurality of color filters 130B.

The plurality of color filters 130R, the plurality of color filters 130G, and the plurality of color filters 130B transmit light having a wavelength corresponding to a predetermined color in the visible light. The plurality of color filters 130R transmit light having a wavelength corresponding to red, that is, the red light. The plurality of color filters 130G transmit light having a wavelength corresponding to green, that is, the green light. The plurality of color filters 130B transmit light having a wavelength corresponding to blue, that is, the blue light. The plurality of color filters 130R, the plurality of color filters 130G, and the plurality of color filters 130B further transmit the infrared light.

The plurality of transparent layers 120 are arranged corresponding to the plurality of color filters 130G. The green light and the infrared light which have passed through the plurality of color filters 130G are incident on the transparent layer 120. The plurality of infrared absorption layers 121 are arranged corresponding to the plurality of color filters 130R and the plurality of color filters 130B. The red light and the infrared light which have passed through the plurality of color filters 130R are incident on the infrared absorption layer 121. The blue light and the infrared light which have passed through the plurality of color filters 130B are incident on the infrared absorption layer 121. The plurality of transparent layers 120 transmit the incident light. That is, the plurality of transparent layers 120 transmit the green light and the infrared light. The plurality of infrared absorption layers 121 absorb only the infrared light in the incident light. That is, the plurality of infrared absorption layers 121 absorb the infrared light and transmit only the red light or the blue light.

Each of the plurality of first photoelectric conversion units 111 is disposed in a region corresponding to any one of the plurality of color filters 130G. The green light and the infrared light which have passed through each of the plurality of transparent layers 120 are incident on any one of the plurality of first photoelectric conversion units 111. The first photoelectric conversion unit 111 absorbs the green light and some infrared light. The first photoelectric conversion unit 111 generates a G signal based on the green light and the infrared light.

Each of the plurality of second photoelectric conversion units 112 is disposed in a region corresponding to any one of the plurality of color filters 130R and the plurality of color filters 130B. The red light or the blue light which has passed through each of the plurality of infrared absorption layers 121 is incident on any one of the plurality of second photoelectric conversion units 112. The second photoelectric conversion unit 112 disposed in a region corresponding to the color filter 130R absorbs the red light and generates an R signal based on the red light. The second photoelectric conversion unit 112 disposed in a region corresponding to the color filter 130B absorbs the blue light and generates a B signal based on the blue light.

A light absorption coefficient of the semiconductor material constituting the first substrate 100 and the second substrate 200 varies depending on a wavelength of light. For this reason, the amount of light which can reach the second substrate 200 varies depending on the wavelength of light. Light having a shorter wavelength is unlikely to reach the second substrate 200, and the infrared light easily reaches the second substrate 200.

Each of the plurality of third photoelectric conversion units 211 is disposed in a region corresponding to any one of the plurality of color filters 130G and any one of the plurality of first photoelectric conversion units 111. The infrared light which has passed through the plurality of first photoelectric conversion units 111 arranged in positions corresponding to the plurality of color filters 130G is incident on the plurality of third photoelectric conversion units 211, and the plurality of third photoelectric conversion units 211 generate IR signals based on the infrared light.

Each of the plurality of signal readout circuits 220 is disposed in a region corresponding to any one of the plurality of color filters 130R and the plurality of color filters 130B. In FIG. 4, a reference numeral of one signal readout circuit 220 is shown as a representative. The signal readout circuit 220 includes, for example, a capacity for accumulating signals and an amplification transistor for amplifying the signals accumulated in the capacity. Each of the plurality of signal readout circuits 220 is disposed to extend to two or more of the plurality of color filters 130R and the plurality of color filters 130B.

As described above, the imaging device 1 includes the first substrate 100, the second substrate 200 stacked on the first substrate 100, and the signal processing unit 30 (signal processing circuit). The first substrate 100 includes the plurality of first photoelectric conversion units 111, the plurality of second photoelectric conversion units 112, and the infrared absorption layer 121. The plurality of first photoelectric conversion units 111 generate a first signal (G signal) based on first visible light (green light) and the infrared light. A wavelength of the first visible light is a first wavelength of a visible light band. The visible light band is a band corresponding to a wavelength of 380 to 750 nm. For example, a wavelength of the green light is 495 to 570 nm. The plurality of second photoelectric conversion units 112 generate a second signal (R signal or B signal) based on only second visible light (red light or blue light). A wavelength of the second visible light is a second wavelength of the visible light band. The second wavelength is different from the first wavelength. For example, a wavelength of the red light is 620 to 750 nm. For example, a wavelength of the blue light is 450 to 495 nm. The infrared absorption layer 121 absorbs the infrared light and transmits only the second visible light.

The second substrate 200 includes the plurality of third photoelectric conversion units 211. The plurality of third photoelectric conversion units 211 generate a third signal (IR signal) based on the infrared light which has passed through the plurality of first photoelectric conversion units.

The signal processing unit 30 (the first signal processing unit 300) generates a fourth signal (G signal) by correcting the first signal (G signal) using the third signal (IR signal). The signal processing unit 30 (first signal processing unit 300) generates a visible light image signal on the basis of the second signal (R signal and B signal) and the fourth signal (G signal). The signal processing unit 30 (the second signal processing unit 310) generates an infrared light image signal on the basis of the third signal (IR signal). The signal processing unit 30 may be disposed on at least one of the first substrate 100 and the second substrate 200. Alternatively, the signal processing unit 30 may also be disposed outside the first substrate 100 and the second substrate 200.

The visible light image signal is a signal for displaying a visible light image. The infrared light image signal is a signal for displaying an infrared light image. The signal processing unit 30 may also perform image processing such as interpolation processing on at least one of the R signal, the G signal, the B signal, and the IR signal.

The first visible light includes the green light. The second visible light includes the red light or the blue light. The plurality of second photoelectric conversion units 112 include the second photoelectric conversion unit 112 which generates the second signal (R signal) based on only the red light, and the second photoelectric conversion unit 112 which generates the second signal (B signal) based on only the blue light. An array of the plurality of first photoelectric conversion units 111 and the plurality of second photoelectric conversion units 112 is an array corresponding to the Bayer array.

The Bayer array is an array of the plurality of color filters 130R, the plurality of color filters 130G, and the plurality of color filters 130B. In the Bayer array, a group including one color filter 130R, two color filters 130G, and one color filter 130B is a unit array.

The G signal generated by the plurality of first photoelectric conversion units 111 contains a component based on the infrared light. In FIG. 3, the first photoelectric conversion unit 111 which generates the G signal containing the component based on the infrared light is described as "G+IR" in the vicinity thereof. The R signal generated by the plurality of second photoelectric conversion units 112 contains a component based on only the red light. In FIG. 3, the second photoelectric conversion unit 112 which generates the R signal containing the component based on only the red light is described as "R" in the vicinity thereof. The B signal generated by the plurality of second photoelectric conversion units 112 contains a component based on only the blue light. In FIG. 3, the second photoelectric conversion unit 122 which generates the B signal containing the component based on only the blue light is described as "B" in the vicinity thereof. The R signal and the B signal do not contain a component based on the infrared light.

The G signal generated by the plurality of first photoelectric conversion units 111 contains the component based on the infrared light. For this reason, it is necessary to correct the G signal using the IR signal generated by the third photoelectric conversion unit 211 to generate the visible light image signal. The corrected G signal is expressed by Equation (1).

$$G' = G - \beta IR(g) \quad (1)$$

In Equation (1), G' is a value of the corrected G signal, and G is a value of the G signal before the correction. In Equation (1), β is a coefficient. In Equation (1), IR(g) is a value of the IR signal generated by the third photoelectric conversion unit 211 disposed in a region corresponding to the color filter 130G. In FIG. 4, the third photoelectric conversion unit 211 which generates the IR signal (IR(g)) is described as "IR(g)" in the vicinity thereof. A value of the coefficient β can be calculated on the basis of spectral sensitivities of the first substrate 100 and the second substrate 200. A value of the coefficient β depends on thicknesses of the first substrate 100 and the second substrate 200, quantum efficiency, and the like.

Since the correction like the one performed on the G signal is not necessary for the R signal and the B signal, noise contained in the visible light image signal is reduced. For this reason, the imaging device 1 can improve the quality of the visible light image signal. In addition, since only the G signal is corrected, signal processing is easily performed.

The plurality of signal readout circuits 220 read the third signal (IR signal) from the plurality of third photoelectric conversion units 211. Each of the plurality of signal readout circuits 220 is disposed in a region corresponding to at least one of the plurality of second photoelectric conversion units 112. That is, the plurality of signal readout circuits 220 are arranged in regions through which a straight line that passes through the plurality of second photoelectric conversion units 112 and that is parallel to the thickness direction D1 of the first substrate 100 passes. The first substrate 100 includes the first surface 110a. A first area S of the third photoelectric conversion unit 211 is larger than a second area S2 of the first photoelectric conversion unit 111. The first area S1 is an area of the third photoelectric conversion unit 211 on a first cross section of the second substrate 200. The second area S2 is an area of the first photoelectric conversion unit 111 on a second cross section of the first substrate 100. The first cross section and the second cross section are parallel to the first surface 110a. The first cross section and the second cross section are surfaces perpendicular to the straight line parallel to the thickness direction D1 of the first substrate 100.

The plurality of infrared absorption layers 121 are arranged corresponding to the plurality of color filters 130R and the plurality of color filters 130B. For this reason, in the second substrate 200, the infrared light is not incident on regions corresponding to the plurality of color filters 130R and the plurality of color filters 130B. In the second substrate 200, since the plurality of signal readout circuits 220 are arranged in the regions corresponding to the plurality of color filters 130R and the plurality of color filters 130B, the first area S1 of the third photoelectric conversion unit 211 can be made larger than the second area S2 of the first photoelectric conversion unit 111. As a result, a saturation amount of the IR signal generated by the third photoelectric conversion unit 211 increases, and thus a dynamic range of the infrared light image increases. Each of the plurality of signal readout circuits 220 is disposed in a region corresponding to only any one of the plurality of first photoelectric conversion units 111. The first area S1 of the third photoelectric conversion unit 211 is not necessarily larger than the second area S2 of the first photoelectric conversion unit 111.

The imaging device of each aspect of the present invention may not include a constituent corresponding to at least one of the lens 10, the display unit 40, the drive control unit 50, the lens control unit 60, the camera control unit 70, the camera operation unit 80, and the storage unit 90. The imaging device of each aspect of the present invention may not include a constituent corresponding to at least one of the transparent layer 120, the infrared absorption layer 121, the color filter 130R, the color filter 130G, the color filter 130B, and the micro-lens 140.

In the first embodiment of the present invention, since an R signal and a B signal with low noise for generating a visible light image signal are obtained by the imaging unit 20, the imaging device 1 can improve the quality of the visible light image signal. Moreover, since the first area S1 of the third photoelectric conversion unit 211 can be made larger than the second area S2 of the first photoelectric conversion unit 111, the dynamic range of the infrared light image increases.

Second Embodiment

Figure 5:
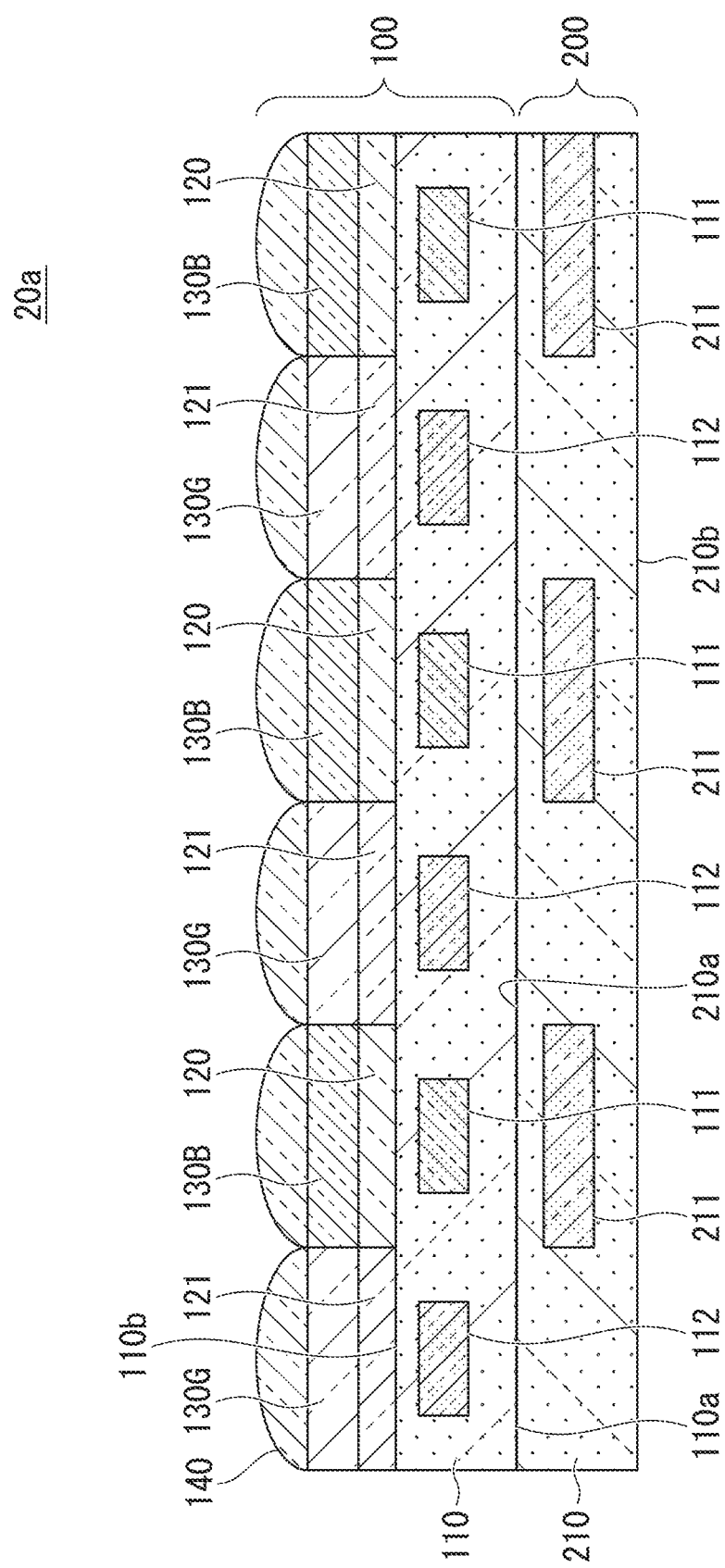
FIG. 5 is a cross-sectional diagram of an imaging unit in an imaging device according to a second embodiment of the present invention.

In a second embodiment of the present invention, the imaging unit 20 shown in FIG. 2 is changed to an imaging unit 20a shown in FIG. 5. Constituents other than the imaging unit 20a are the same as the constituents of the imaging device 1 of the first embodiment. FIG. 5 shows a cross-section of a part of the imaging unit 20a. As shown in FIG. 5, the imaging unit 20a includes a first substrate 100 and a second substrate 200. In the configuration shown in FIG. 5, differences from the configuration shown in FIG. 2 will be described.

A plurality of color filters 130B are arranged on surfaces of a plurality of transparent layers 120. A plurality of color filters 130G and a plurality of color filters 130R are arranged on surfaces of a plurality of infrared absorption layers 121. In FIG. 5, the plurality of color filters 130R are not shown.

In terms of other points except for the above point, the configuration shown in FIG. 5 is the same as the configuration shown in FIG. 2.

Figure 6:
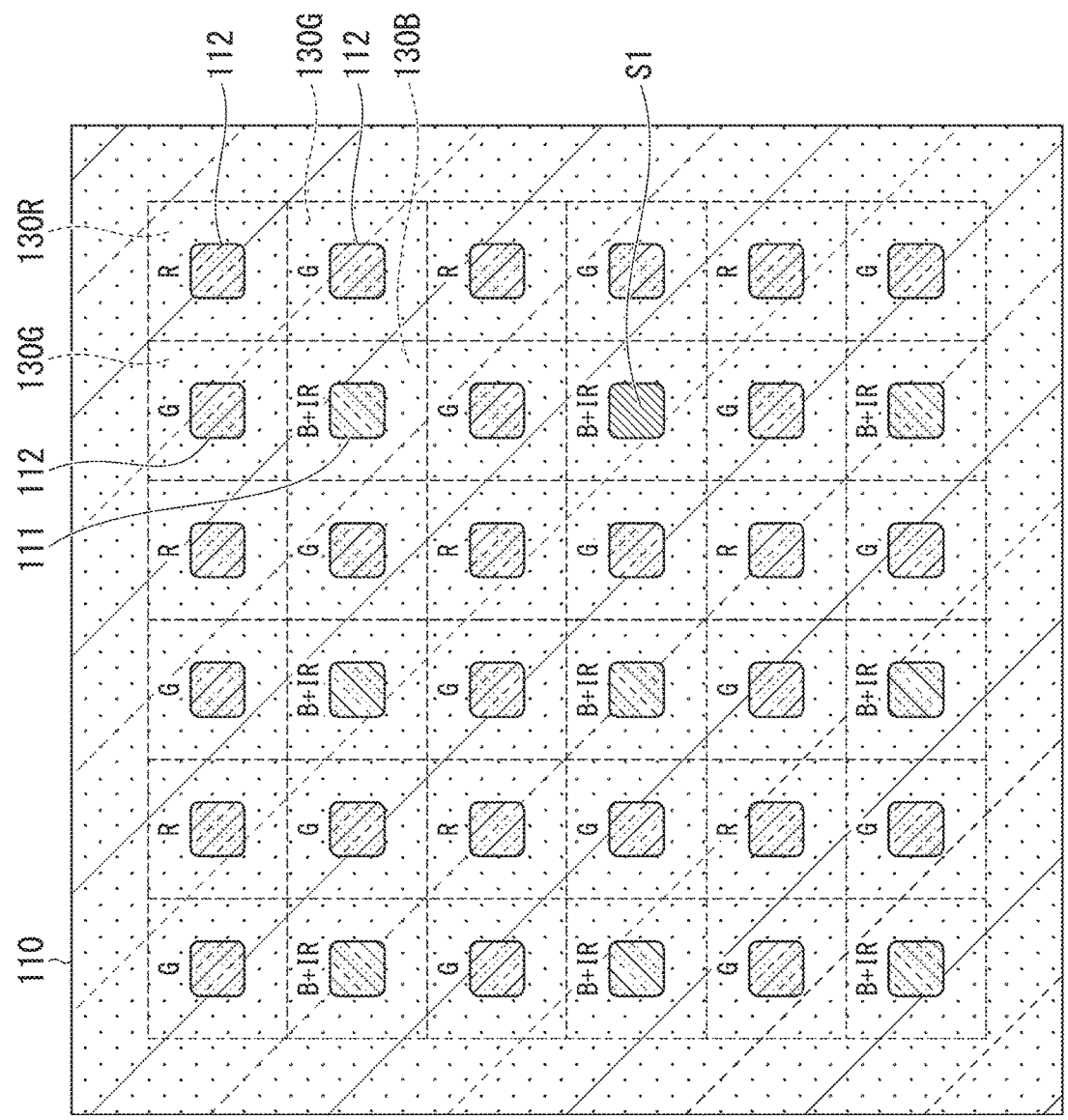
FIG. 6 is a cross-sectional diagram which shows an array of a plurality of first photoelectric conversion units and a plurality of second photoelectric conversion units in the imaging device according to the second embodiment of the present invention.
Figure 7:
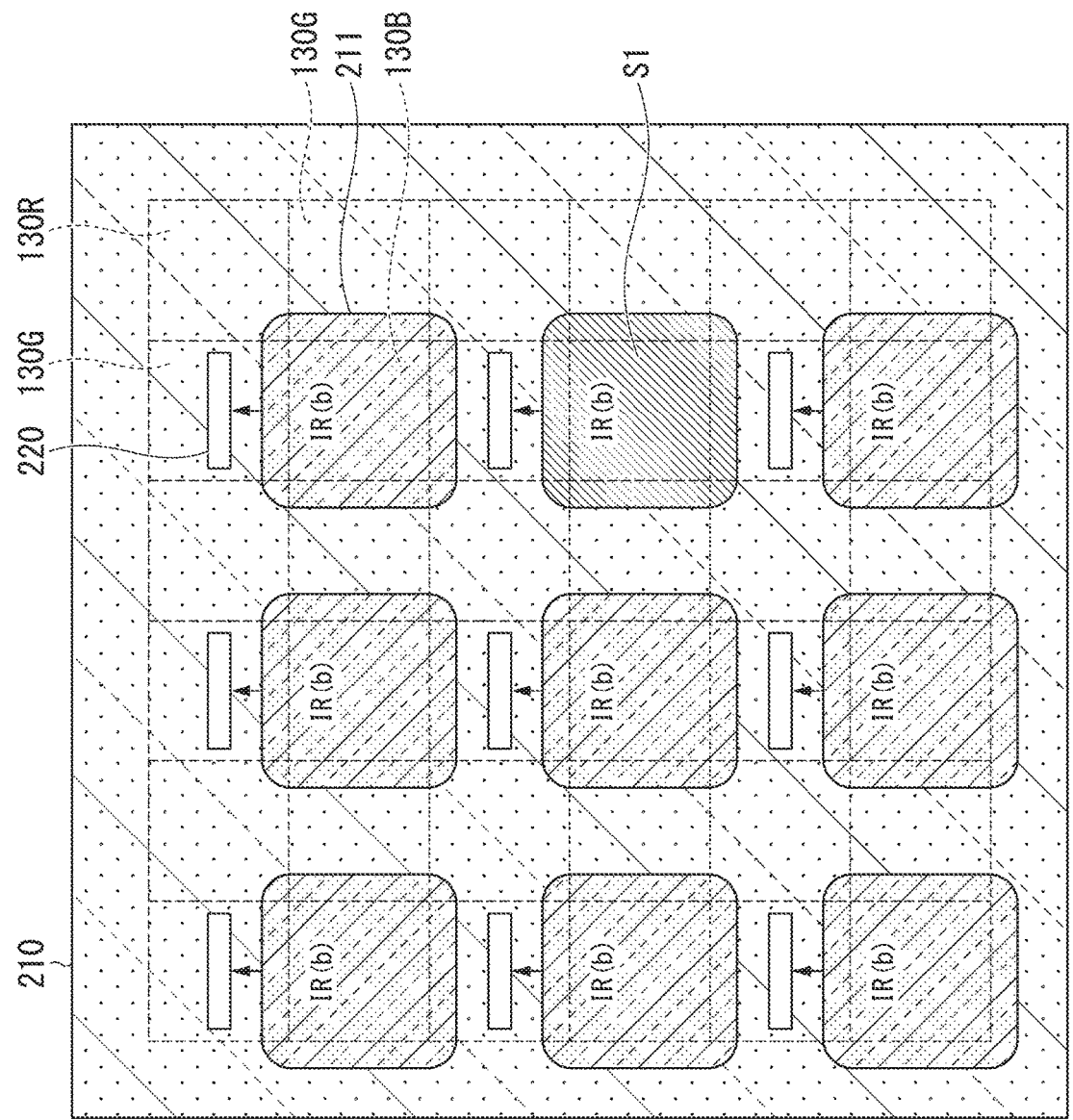
FIG. 7 is a cross-sectional diagram which shows an array of a plurality of third photoelectric conversion units in the imaging device according to the second embodiment of the present invention.

FIG. 6 shows an array of the plurality of first photoelectric conversion units 111 and the plurality of second photoelectric conversion units 112. FIG. 7 shows an array of the plurality of third photoelectric conversion units 211. In FIG. 6 and FIG. 7, a thickness direction D1 of the first substrate 100 is a direction perpendicular to a sheet of each figure. In FIG. 6, reference numerals of two first photoelectric conversion units 111 and two second photoelectric conversion units 112 are shown as representatives. In FIG. 7, a reference numeral of one third photoelectric conversion unit 211 is shown as a representative. In FIG. 6 and FIG. 7, positions of the plurality of color filters 130R, the plurality of color filters 130G, and the plurality of color filters 130B are indicated by dashed lines. In FIG. 6 and FIG. 7, reference numerals of one color filter 130R, two color filters 130G, and one color filter 130B are shown as representatives. The plurality of first photoelectric conversion units 111, the plurality of second photoelectric conversion units 112, and the plurality of third photoelectric conversion units 211 are arranged in a matrix. In addition, the plurality of color filters 130R, the plurality of color filters 130G, and the plurality of color filters 130B are arranged in a matrix as the Bayer array.

Light passing through the plurality of micro-lenses 140 is incident on the plurality of color filters 130R, the plurality of color filters 130G, and the plurality of color filters 130B. The plurality of color filters 130R transmit the red light and the infrared light. The plurality of color filters 130G transmit the green light and the infrared light. The plurality of color filters 130B transmit the blue light and the infrared light.

The plurality of transparent layers 120 are arranged corresponding to the plurality of color filters 130B. The blue light and the infrared light passing through the plurality of color filters 130B are incident on the transparent layer 120. The plurality of infrared absorption layers 121 are arranged corresponding to the plurality of color filters 130R and the plurality of color filters 130G. The red light and the infrared light passing through the plurality of color filters 130R are incident on the infrared absorption layer 121. The green light and the infrared light passing through the plurality of color filters 130G are incident on the infrared absorption layer 121. The plurality of transparent layers 120 transmit the blue light and the infrared light. The plurality of infrared absorption layers 121 absorb the infrared light and transmit only the red light or the green light.

Each of the plurality of first photoelectric conversion units 111 is disposed in a region corresponding to any one of the plurality of color filters 130B. The blue light and the infrared light passing through each of the plurality of transparent layers 120 are incident on any one of the plurality of first photoelectric conversion units 111. The first photoelectric conversion unit 111 absorbs the blue light and some infrared light. The first photoelectric conversion unit 111 generates a B signal based on the blue light and the infrared light.

Each of the plurality of second photoelectric conversion units 112 is disposed in a region corresponding to any one of the plurality of color filters 130R and the plurality of color filters 130G. The red light or the green light passing through each of the plurality of infrared absorption layers 121 are incident on any one of the plurality of second photoelectric conversion units 112. The second photoelectric conversion unit 112 disposed in a region corresponding to the color filter 130R generates the R signal based on the red light. The second photoelectric conversion unit 112 disposed in a region corresponding to the color filter 130G generates the G signal based on the green light.

Each of the plurality of third photoelectric conversion units 211 is disposed in regions corresponding to any one of the plurality of color filters 130B and any one of the plurality of first photoelectric conversion units 111. The infrared light passing through the plurality of first photoelectric conversion units 111 arranged in regions corresponding to the plurality of color filters 130B is incident on the plurality of third photoelectric conversion units 211. The plurality of third photoelectric conversion units 211 generate the IR signal based on the infrared light.

Each of the plurality of signal readout circuits 220 is disposed in a region corresponding to any one of the plurality of color filters 130G. In FIG. 7, a reference numeral of one signal readout circuit 220 is shown as a representative. Each of the plurality of signal readout circuits 220 may also be disposed in regions corresponding to two or more of the plurality of color filters 130G and the plurality of color filters 130R.

In the second embodiment, the plurality of first photoelectric conversion units 111 generate a first signal (B signal) based on first visible light (blue light) and the infrared light. The plurality of second photoelectric conversion units 112 generates a second signal (R signal or G signal) based on only second visible light (red light and green light). The plurality of third photoelectric conversion units 211 generate a third signal (IR signal) based on the infrared light passing through the plurality of first photoelectric conversion units.

The signal processing unit 30 (the first signal processing unit 300) generates a fourth signal (B signal) by correcting the first signal (B signal) using the third signal (IR signal). The signal processing unit 30 (the first signal processing unit 300) generates the visible light image signal on the basis of the second signal (R signal or G signal) and the fourth signal (B signal). The signal processing unit 30 (the second signal processing unit 310) generates the infrared light image signal on the basis of the third signal (IR signal).

The first visible light includes the blue light. The second visible light includes the red light or the green light. The plurality of second photoelectric conversion units 112 include the second photoelectric conversion unit 112 which generates the second signal (R signal) based on only the red light, and the second photoelectric conversion unit 112 which generates the second signal (G signal) based on only the green light. An array of the plurality of first photoelectric conversion units 111 and the plurality of second photoelectric conversion units 112 is an array corresponding to the Bayer array.

The B signal generated by the plurality of first photoelectric conversion units 111 contains a component based on the infrared light. In FIG. 6, the first photoelectric conversion unit 111 which generates the B signal containing the component based on the infrared light is described as "B+IR" in the vicinity thereof. The R signal generated by the plurality of second photoelectric conversion units 112 contains a component based on only the red light. In FIG. 6, the second photoelectric conversion unit 112 which generates the R signal containing the component based on only the red light is described as "R" in the vicinity thereof. The G signal generated by the plurality of second photoelectric conversion units 112 contains a component based on only the green light. In FIG. 6, the second photoelectric conversion unit 112 which generates the G signal containing the component based on only the green light is described as "G" in the vicinity thereof. The R signal and the G signal do not contain a component based on the infrared light.

The B signal generated by the plurality of first photoelectric conversion units 111 contains the component based on the infrared light. For this reason, it is necessary to correct the B signal using the IR signal generated by the third photoelectric conversion units 211 to generate the visible light image signal. The corrected B signal is expressed by Equation (2).

$$B'=B-\gamma IR(b) \tag{2}$$

In Equation (2), B' is a value of the corrected B signal, and B is a value of the B signal before the correction. In Equation (2), $\gamma$ is a coefficient. In Equation (2), IR(b) is a value of the IR signal generated by the third photoelectric conversion units 211 arranged in regions corresponding to the color filters 130B. In FIG. 7, the third photoelectric conversion unit 211 which generates the IR signal (IR(b)) is described as "IR(b)" in the vicinity thereof. A value of the coefficient $\gamma$ can be calculated on the basis of spectral sensitivities of the first substrate 100 and the second substrate 200. The value of the coefficient $\gamma$ depends on the thicknesses of the first substrate 100 and the second substrate 200, quantum efficiency, and the like.

Since the correction like the one performed on the B signal is not necessary for the R signal and the G signal, noise included in the visible light image signal is reduced. For this reason, the imaging device 1 can improve the quality of the visible light image signal. In addition, since only the B signal is corrected, signal processing is easily performed.

The plurality of signal readout circuits 220 read the third signal (IR signal) from the plurality of third photoelectric conversion units 211. Each of the plurality of signal readout circuits 220 is disposed in a region corresponding to at least one of the plurality of second photoelectric conversion units 112. The first substrate 100 includes the first surface 110a.

The first area S1 of the third photoelectric conversion unit 211 is larger than the second area S2 of the first photoelectric conversion unit 111. The first area S1 is an area of the third photoelectric conversion unit 211 on a second surface. The second area S2 is an area of the first photoelectric conversion unit 111 on a third surface. The second surface and the third surface are parallel to the first surface 110a.

In the second substrate 200, since the plurality of signal readout circuits 220 are arranged in regions corresponding to the plurality of color filters 130G and the plurality of color filters 130R, the first area S1 of the third photoelectric conversion unit 211 can be made larger than the second area S2 of the first photoelectric conversion unit Ill. The plurality of signal readout circuits 220 may be arranged in regions corresponding to the plurality of color filters 130R.

In the imaging unit 20 of the first embodiment, since the plurality of third photoelectric conversion units 211 are arranged in regions corresponding to the plurality of color filters 130G, the number of the plurality of third photoelectric conversion units 211 is greater than in the imaging unit 20a of the second embodiment. For this reason, a resolution of infrared light images is high.

In the imaging unit 20a of the second embodiment, the number of the plurality of third photoelectric conversion units 211 is less than in the imaging unit 20 of the first embodiment. For this reason, first areas S1 of the plurality of third photoelectric conversion units 211 can be made larger. As a result, the dynamic range of the infrared light image increases.

There is a possibility that the visible light is incident on the second substrate 200. Since a visible light component having a shorter wavelength is easily absorbed by the first substrate 100, the visible light incident on the plurality of third photoelectric conversion units 211 is reduced more. As a result, the imaging device 1 can obtain a faithful infrared light image for the infrared light.

In the second embodiment of the present invention, the imaging device 1 can improve the quality of the visible light image signal. Since the first area S1 of the third photoelectric conversion unit 211 can be made larger, the dynamic range of the infrared light image increases. The imaging device 1 can obtain more faithful infrared light images for infrared light.

Third Embodiment

Figure 8:
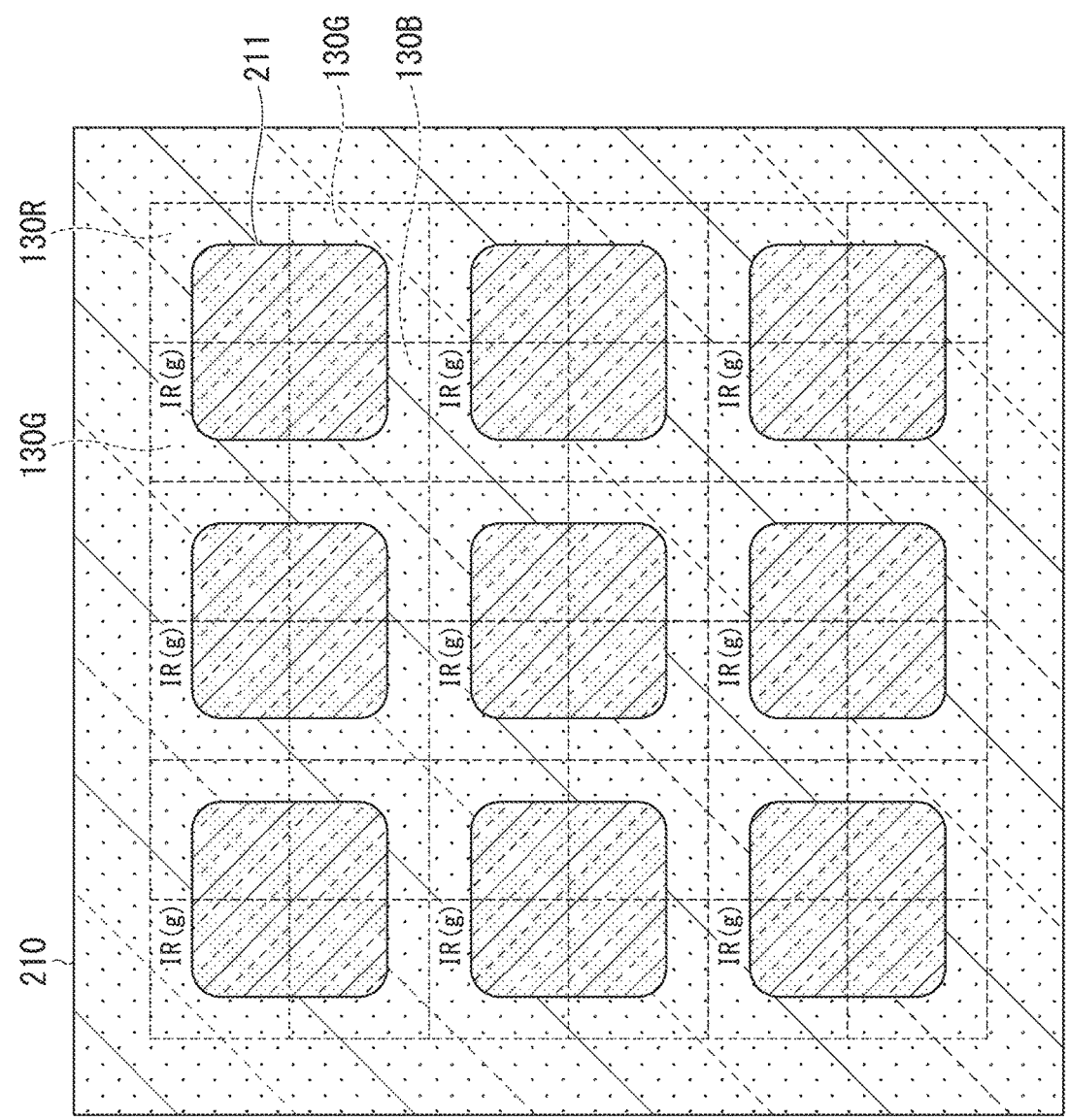
FIG. 8 is a cross-sectional diagram which shows an array of a plurality of third photoelectric conversion units in an imaging device according to a third embodiment of the present invention.

In an imaging device 1 according to a third embodiment of the present invention, an array of the plurality of third photoelectric conversion units 211 is changed to the array shown in FIG. 8 from the array shown in FIG. 4. Constituents other than the array shown in FIG. 8 are the same as the constituents of the imaging device 1 of the first embodiment.

FIG. 8 shows an array of the plurality of third photoelectric conversion units 211. In FIG. 8, the thickness direction D1 of the first substrate 100 is a direction perpendicular to a sheet of the figure. In FIG. 8, a reference numeral of one third photoelectric conversion unit 211 is shown as a representative. In FIG. 8, positions of the plurality of color filters 130R, the plurality of color filters 130G, and the plurality of color filters 130B are indicated by dashed lines. In FIG. 8, reference numerals of one color filter 130R, two color filters 130G, and one color filter 130B are shown as representatives. The plurality of third photoelectric conversion units 211 are arranged in a matrix. In addition, the plurality of color filters 130R, the plurality of color filters 130, and the plurality of color filters 130B are arranged in a matrix as the Bayer array. In FIG. 8, the signal readout circuit 220 is not shown. For example, the plurality of signal readout circuits 220 are arranged in regions in which the plurality of third photoelectric conversion units 211 are not disposed in the second semiconductor layer 210.

Each of the plurality of third photoelectric conversion units 211 is disposed in regions corresponding to one color filter 130R, two color filters 130G, and one color filter 130B. Each of the plurality of third photoelectric conversion units 211 receives light passing through two or more of the plurality of first photoelectric conversion units 111. Each of the plurality of third photoelectric conversion units 211 shown in FIG. 8 receives light passing through two first photoelectric conversion units 111 arranged in a region corresponding to the color filter 130G. For this reason, in the imaging unit 20 of the third embodiment, the plurality of third photoelectric conversion units 211 have larger first areas S1 than in the imaging unit 20 of the first embodiment. As a result, the dynamic range of the infrared light image increases.

In the third embodiment of the present invention, the imaging device 1 can improve the quality of the visible light image signal. The imaging unit 20 can generate the R signal, the G signal, and the B signal which improve the quality of the visible light image signal. The first area S1 of the third photoelectric conversion unit 211 can be made larger, such that the dynamic range of the infrared light image increases.

Fourth Embodiment

Figure 9:
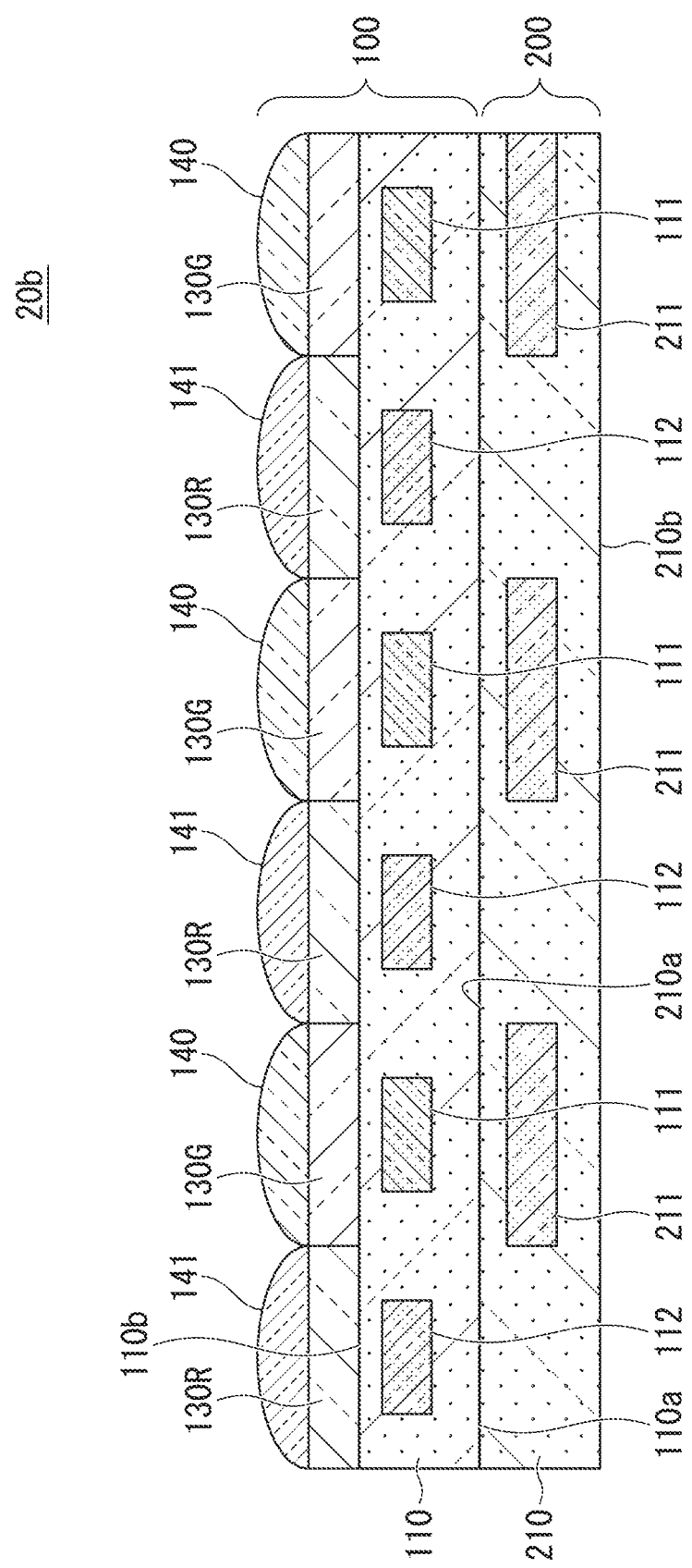
FIG. 9 is a cross-sectional diagram of an imaging unit in an imaging device according to a fourth embodiment of the present invention.

In a fourth embodiment of the present invention, the imaging unit 20 shown in FIG. 2 is changed to an imaging unit 20b shown in FIG. 9. Constituents other than the imaging unit 20b are the same as the constituents of the imaging device 1 of the first embodiment. FIG. 9 shows a cross-section of a part of the imaging unit 20b. As shown in FIG. 9, the imaging unit 20b includes a first substrate 100 and a second substrate 200. In the configuration shown in FIG. 9, differences from the configuration shown in FIG. 2 will be described.

The first substrate 100 includes a first semiconductor layer 110, a plurality of color filters 130R, a plurality of color filters 130C a plurality of micro-lenses 140, and a plurality of micro-lenses 141.

In the imaging unit 20b shown in FIG. 9, the transparent layer 120 and the infrared absorption layer 121 in the imaging unit 20 shown in FIG. 2 are not disposed. In the imaging unit 20b shown in FIG. 9, some of the plurality of micro-lenses 140 in the imaging unit 20 shown in FIG. 2 are changed to the plurality of micro-lenses 141. In the imaging unit 20b shown in FIG. 9, the micro-lens 141 is constituted by a transparent resin to which an infrared absorption dye is added. The infrared absorption dye constituting the micro-lens 141 is the same as the infrared absorption dye constituting the infrared absorption layer 121 in the imaging unit 20 of the first embodiment. The plurality of micro-lenses 141 absorb the infrared light and transmit only the visible light including the red light and the blue light. That is, the plurality of micro-lenses 141 also serve as an infrared absorption layer.

In terms of other points except for the above point, the configuration shown in FIG. 9 is the same as the configuration shown in FIG. 2.

In the fourth embodiment of the present invention, the imaging device 1 can improve the quality of the visible light image signal. The imaging unit 20b can generate the R signal, the G signal, and the B signal which can improve the quality of the visible light image signal. Since the first area S1 of the third photoelectric conversion unit 211 can be made larger than the second area S2 of the first photoelectric conversion unit 111, the dynamic range of the infrared light image increases. It is not necessary to form a plurality of transparent layers 120 and a plurality of infrared absorption layers 121.

Fifth Embodiment

Figure 10:
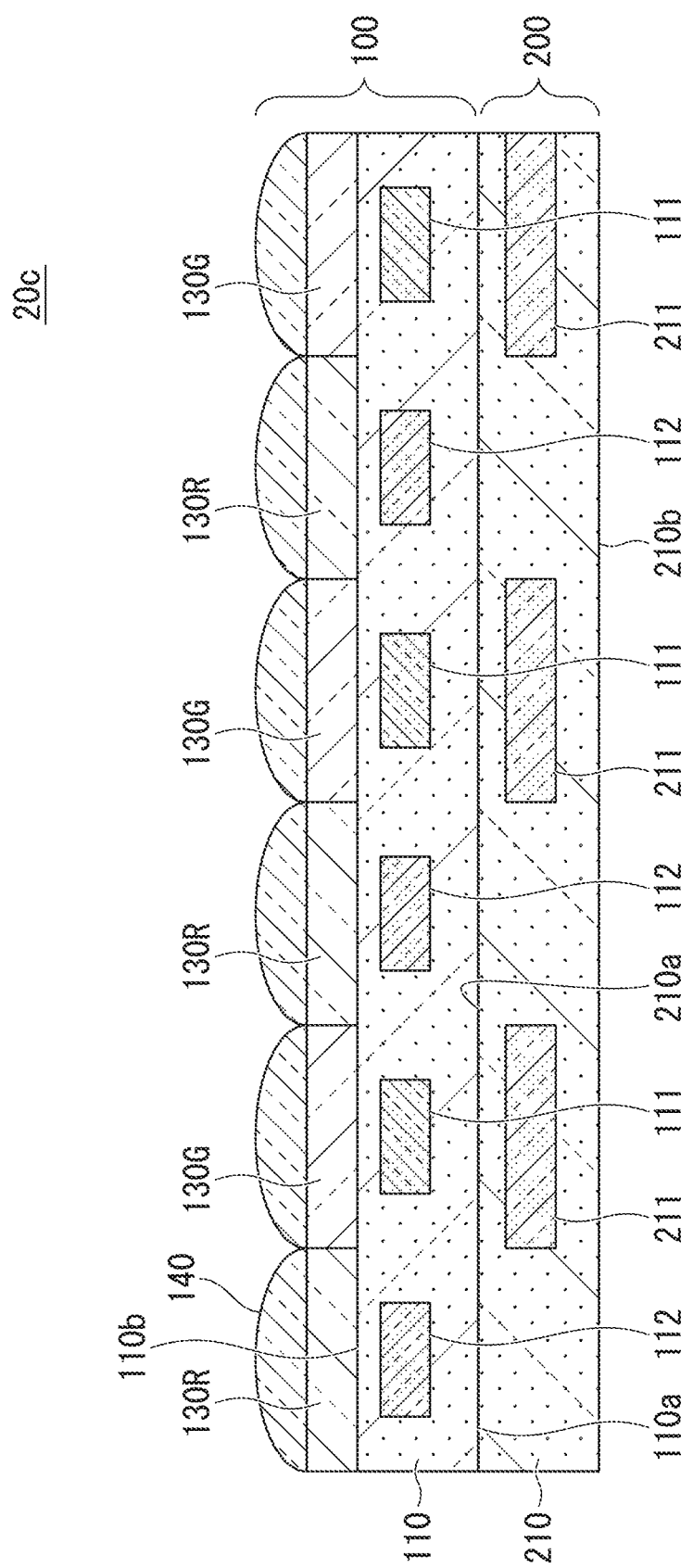
FIG. 10 is a cross-sectional diagram of an imaging unit in an imaging device according to a fifth embodiment of the present invention.
Figure 11:
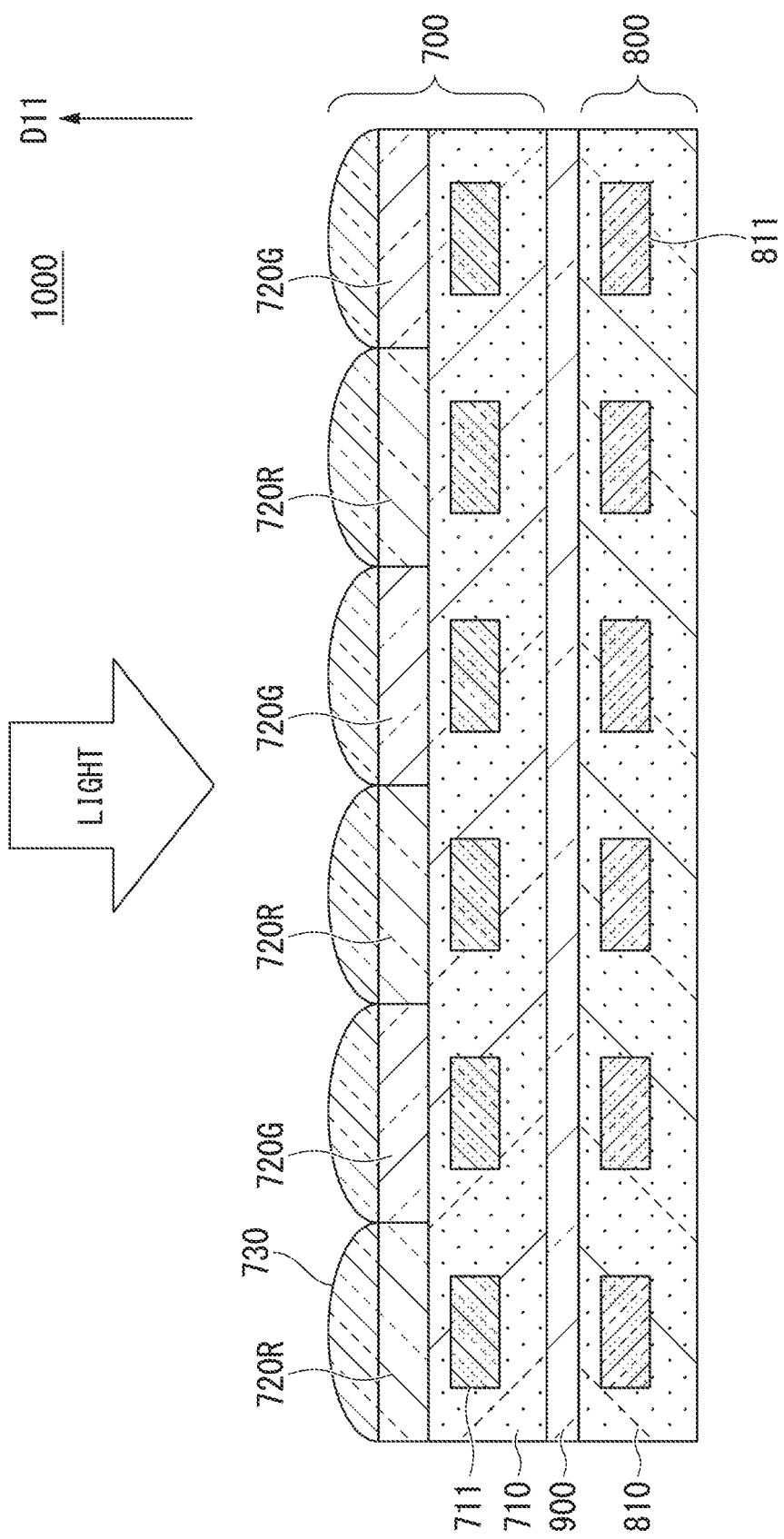
FIG. 11 is a cross-sectional diagram of an imaging unit in an imaging device of the related art.
Figure 12:
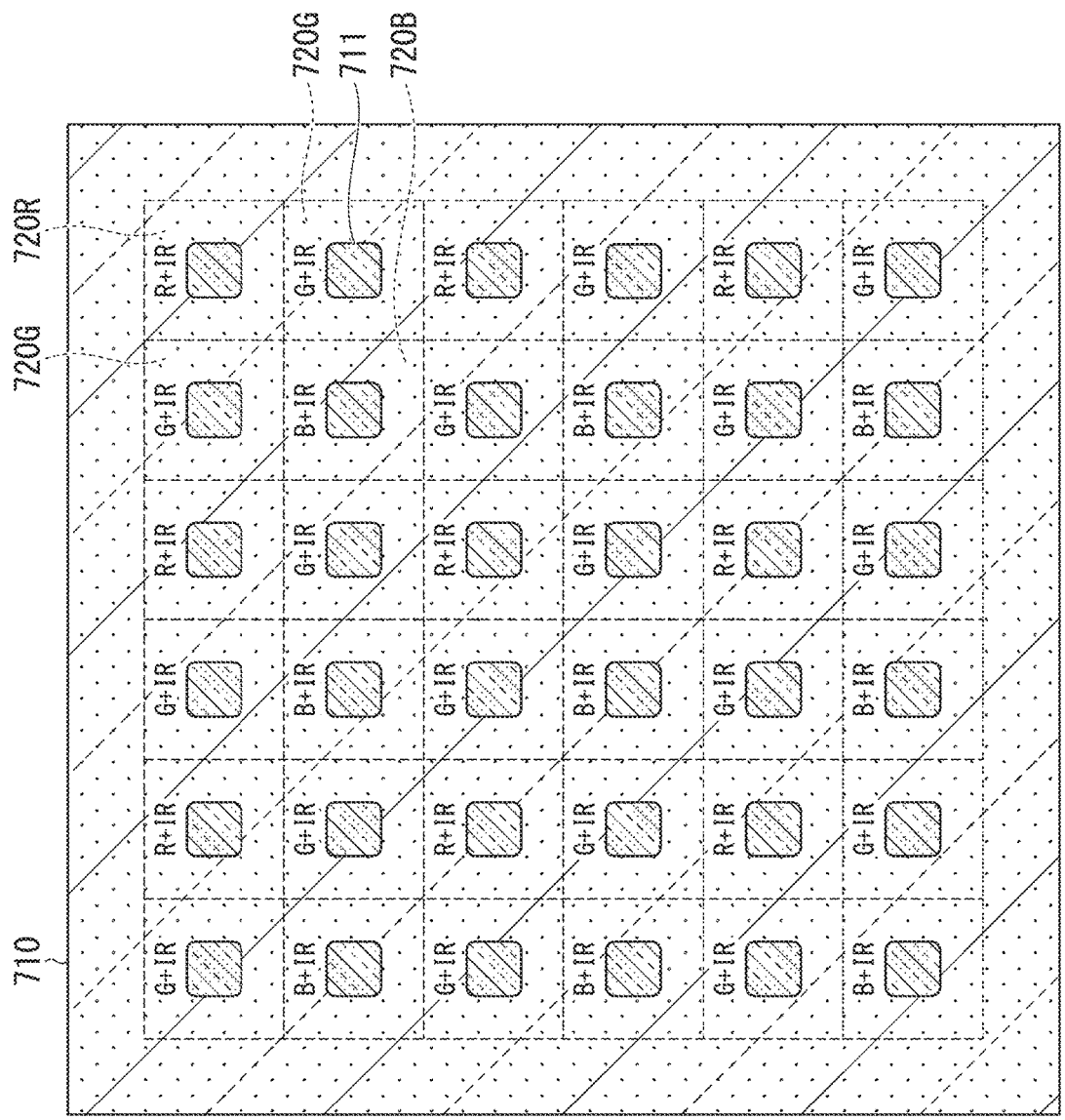
FIG. 12 is a cross-sectional diagram which shows an array of a plurality of first photoelectric conversion units in the imaging device of the related art.
Figure 13:
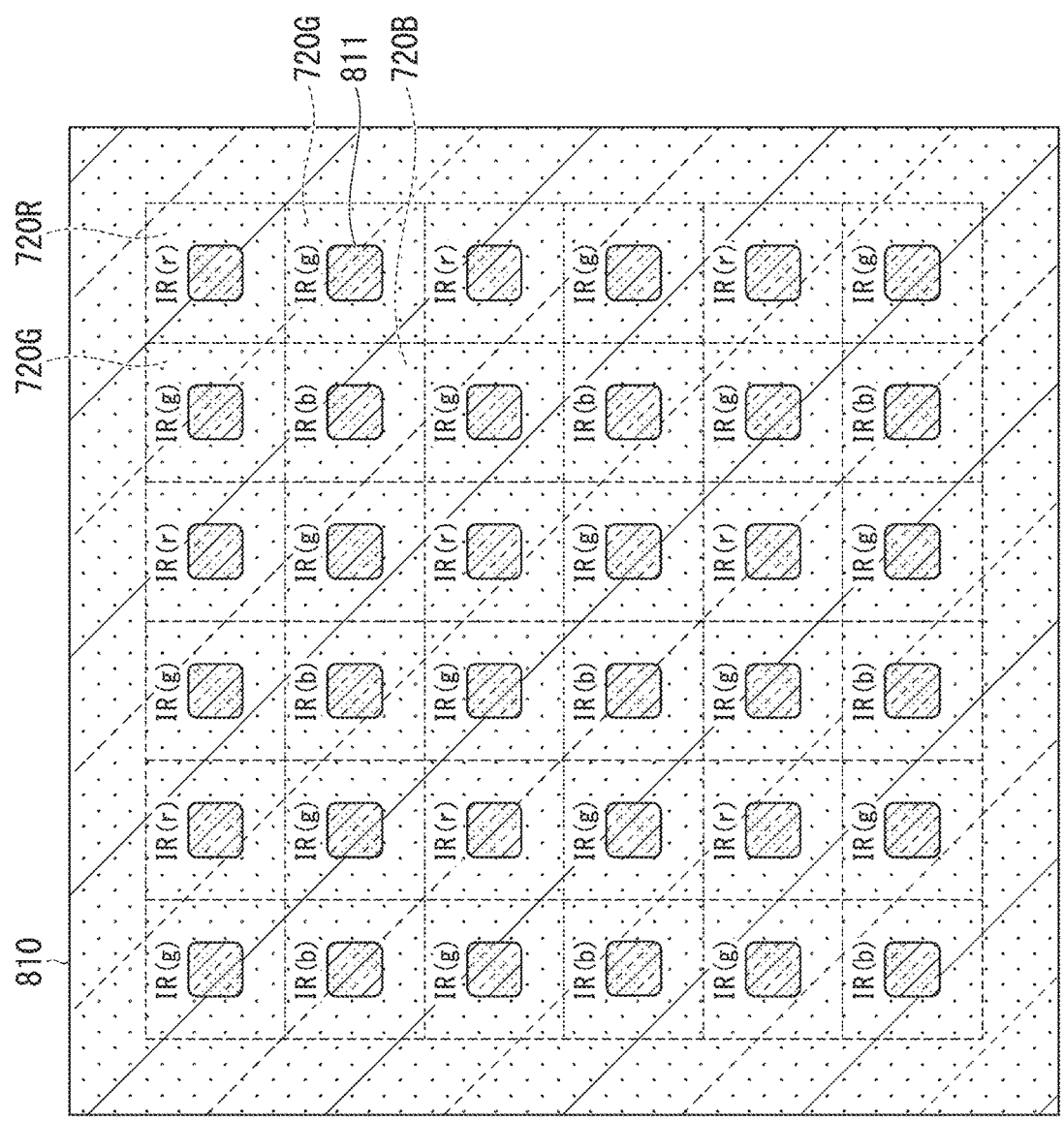
FIG. 13 is a cross-sectional diagram which shows an array of a plurality of second photoelectric conversion units in the imaging device of the related art.

In a fifth embodiment of the present invention, the imaging unit 20 shown in FIG. 2 is changed to an imaging unit 20c shown in FIG. 10. Constituents other than the imaging unit 20c are the same as the constituents of the imaging device 1 of the first embodiment. FIG. 10 shows a cross-section of a part of the imaging unit 20c. As shown in FIG. 10, the imaging unit 20c includes a first substrate 100 and a second substrate 200. In the configuration shown in FIG. 10, differences from the configuration shown in FIG. 2 will be described.

The first substrate 100 includes a first semiconductor layer 110, a plurality of color filters 130R, a plurality of color filters 130G, and a plurality of micro-lenses 140.

In the imaging unit 20c shown in FIG. 10, the transparent layer 120 and the infrared absorption layer 121 in the imaging unit 20 shown in FIG. 2 are not disposed. In the imaging unit 20c shown in FIG. 10, the color filter 130R and the color filter 130B are constituted by a transparent resin to which an infrared absorption dye is added. In FIG. 10, a plurality of color filters 130B are not shown. Infrared absorption dyes which constitute the color filter 130R and the color filter 130B are the same as the infrared absorption dyes constituting the infrared absorption layer 121 in the imaging unit 20 of the first embodiment. The plurality of color filters 130R absorb the infrared light and transmit only the red light. The plurality of color filters 130B absorb the infrared light and transmit only the blue light. That is, the plurality of color filters 130R and the plurality of color filters 130B serve as an infrared absorption layer.

In terms of other points except for the above point, the configuration shown in FIG. 10 is the same as the configuration shown in FIG. 2.

In the fifth embodiment of the present invention, the imaging device 1 can improve the quality of the visible light image signal. The imaging unit 20c can generate the R signal, the G signal, and the B signal which improve the quality of the visible light image signal. Since the first area S1 of the third photoelectric conversion unit 211 can be made larger than the second area S2 of the first photoelectric conversion unit 111, the dynamic range of the infrared light image increases. It is not necessary to form a plurality of transparent layers 120 and a plurality of infrared absorption layers 121.

While preferred embodiments of the invention have been described and shown above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An imaging device, comprising:
a first substrate;
a second substrate stacked on the first substrate; and
a signal processing circuit,
wherein the first substrate includes
a plurality of first photoelectric conversion units configured to generate a first signal based on first visible light and infrared light, a wavelength of the first visible light being a first wavelength of a visible light band,
a plurality of second photoelectric conversion units configured to generate a second signal based on only second visible light, a wavelength of the second visible light being a second wavelength of the visible light band, the second wavelength being different from the first wavelength, and
an infrared absorption layer configured to absorb the infrared light and transmits only the second visible light,
the second substrate includes a plurality of third photoelectric conversion units configured to generate a third signal based on the infrared light passing through the plurality of first photoelectric conversion units,
the signal processing circuit generates a fourth signal by correcting the first signal using the third signal,
the signal processing circuit generates a visible light image signal on the basis of the second signal and the fourth signal, and
the signal processing circuit generates an infrared light image signal on the basis of the third signal.

2. The imaging device according to claim 1, wherein the infrared absorption layer is a plurality of micro-lenses.

3. The imaging device according to claim 1, wherein the infrared absorption layer is a plurality of color filters.

4. The imaging device according to claim 1, wherein the second substrate further includes a plurality of signal readout circuits configured to read the third signal from the plurality of third photoelectric conversion units,
each of the plurality of signal readout circuits is disposed in a region corresponding to at least one of the plurality of second photoelectric conversion units,
the first substrate includes a surface which is in contact with the second substrate,
a first area of the third photoelectric conversion unit is larger than a second area of the first photoelectric conversion unit, the first area being an area of the third photoelectric conversion unit on a first cross section of the second substrate, the second area being an area of the first photoelectric conversion unit on a second cross section of the first substrate, and
the first cross section and the second cross section are parallel to the surface.

5. The imaging device according to claim 1, wherein the first visible light includes green light, the second visible light includes red light or blue light, the plurality of second photoelectric conversion units include
the second photoelectric conversion unit which generates the second signal based on only the red light, and
the second photoelectric conversion unit which generates the second signal based on only the blue light, and
an array of the plurality of first photoelectric conversion units and the plurality of second photoelectric conversion units is an array corresponding to the Bayer array.

6. The imaging device according to claim 1, wherein the first visible light includes blue light, the second visible light includes red light or green light, the plurality of second photoelectric conversion units include
- the second photoelectric conversion unit which generates the second signal based on only the red light, and
- the second photoelectric conversion unit which generates the second signal based on only the green light, and an array of the plurality of first photoelectric conversion units and the plurality of second photoelectric conversion units is an array corresponding to the Bayer array.

7. The imaging device according to claim 1,
wherein each of the plurality of third photoelectric conversion units receive light passing through two or more of the plurality of first photoelectric conversion units.

* * * * *